US012631665B2

(12) United States Patent　　　　(10) Patent No.:　US 12,631,665 B2
Takizawa　　　　　　　　　　　　　　(45) Date of Patent:　　May 19, 2026

(54) INERTIAL SENSOR, METHOD FOR MANUFACTURING INERTIAL SENSOR, AND INERTIAL MEASUREMENT UNIT

(71) Applicant: SEIKO EPSON CORPORATION, Tokyo (JP)

(72) Inventor: Teruo Takizawa, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 433 days.

(21) Appl. No.: 18/095,102

(22) Filed: Jan. 10, 2023

(65) Prior Publication Data

US 2023/0221346 A1　　Jul. 13, 2023

(30) Foreign Application Priority Data

Jan. 11, 2022　(JP) ................................. 2022-002100

(51) Int. Cl.
*G01C 19/5783*　　　(2012.01)
*B81B 7/00*　　　　(2006.01)
*B81C 1/00*　　　　(2006.01)
*G01P 3/483*　　　　(2006.01)
(Continued)

(52) U.S. Cl.
CPC .......... *G01P 15/125* (2013.01); *B81B 7/0038* (2013.01); *B81C 1/00285* (2013.01); *G01P 3/483* (2013.01); *G01P 15/18* (2013.01); *B81B 2201/0235* (2013.01); *B81B 2201/0242* (2013.01); *B81C 2203/019* (2013.01)

(58) Field of Classification Search
None
See application file for complete search history.

(56) References Cited

U.S. PATENT DOCUMENTS 6,251,698 B1 * 6/2001 Lefort ................. G01P 15/0802
　　　　　　　　　　　　　　　　　　　　438/22
7,902,517 B1 * 3/2011 Ianakiev ................... G01T 3/08
　　　　　　　　　　　　　　　　　　　　250/390.01
(Continued)

FOREIGN PATENT DOCUMENTS

CN　　102098021 A　*　6/2011　............... H03H 9/21
CN　　107032293 A　*　8/2017　............... B81B 7/02
(Continued)

OTHER PUBLICATIONS

Definition of weld from the Merriam-Webster Dictionary online; URL: https://www.merriam-webster.com/dictionary/weld (Year: 2025).*

*Primary Examiner* — Stephen D Meier
*Assistant Examiner* — Ruben C Parco, Jr.
(74) *Attorney, Agent, or Firm* — Harness, Dickey & Pierce, P.L.C.

(57)　　　　　　　ABSTRACT

An inertial sensor 1 includes: a base body; a lid body facing the base body; a functional element disposed in a cavity between the base body and the lid body and including a semiconductor layer; an adhesive layer disposed in a peripheral region surrounding the cavity and adhering the base body and the lid body to each other; and a sealer configured to seal a hole which communicates the cavity with an outside and which is disposed in the peripheral region. The sealer is provided in contact with the lid body and the base body, and includes a material of the lid body and a material of the adhesive layer.

4 Claims, 18 Drawing Sheets

(51) Int. Cl.
    G01P 15/125       (2006.01)
    G01P 15/18        (2013.01)

(56)            References Cited

U.S. PATENT DOCUMENTS

| | | | | |
|---|---|---|---|---|
| 2002/0180031 A1* | 12/2002 | Yamaguchi | ............. | H01L 23/10 |
| | | | | 257/E23.193 |
| 2013/0074596 A1* | 3/2013 | Takizawa | ........... | G01C 19/5712 |
| | | | | 29/527.1 |
| 2013/0208438 A1 | 8/2013 | Takagi | | |
| 2014/0146451 A1* | 5/2014 | Aoki | ................... | H03H 9/1057 |
| | | | | 361/679.01 |
| 2015/0108591 A1 | 4/2015 | Takizawa | | |
| 2015/0313016 A1 | 10/2015 | Naruse | | |
| 2016/0061853 A1 | 3/2016 | Takizawa | | |
| 2016/0146851 A1* | 5/2016 | Kamisuki | ........... | G01P 15/0802 |
| | | | | 73/514.32 |
| 2018/0339900 A1 | 11/2018 | Breitling et al. | | |

FOREIGN PATENT DOCUMENTS

| | | | | | |
|---|---|---|---|---|---|
| CN | 113636522 A | | 11/2021 | | |
| JP | S59-143264 A | | 8/1984 | | |
| JP | 2003240797 A | * | 8/2003 | .......... | B81B 7/0006 |
| JP | 2013-016657 A | | 1/2013 | | |
| JP | 2013-069858 A | | 4/2013 | | |
| JP | 2013140084 A | * | 7/2013 | | |
| JP | 2013-164285 A | | 8/2013 | | |
| JP | 2014120499 A | * | 6/2014 | | |
| JP | 2015-081774 A | | 4/2015 | | |
| JP | 2015-207727 A | | 11/2015 | | |
| JP | 2016-018949 A | | 2/2016 | | |
| JP | 2016-032058 A | | 3/2016 | | |
| JP | 2016-048176 A | | 4/2016 | | |
| JP | 2016-099224 A | | 5/2016 | | |

* cited by examiner

FIG. 4

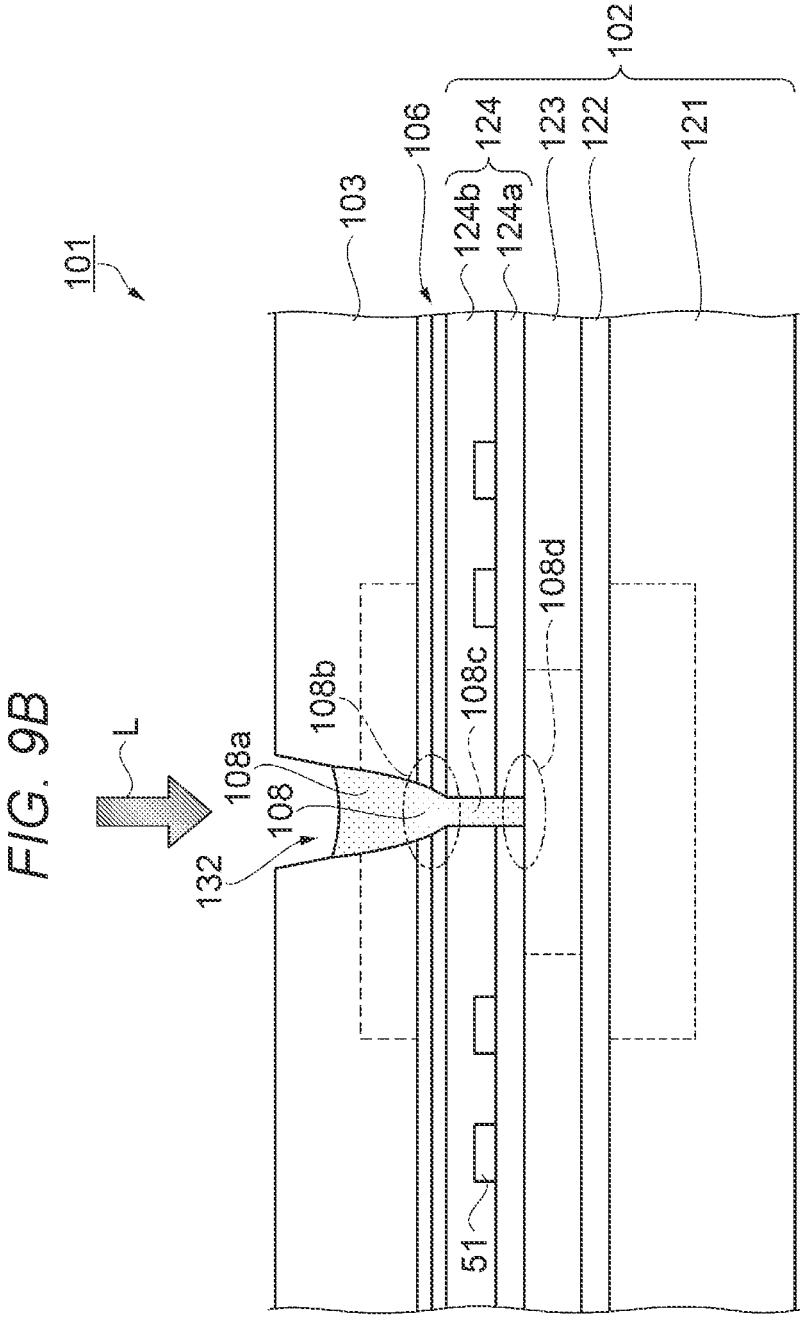
*FIG. 9B*
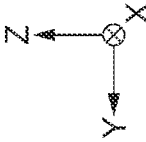

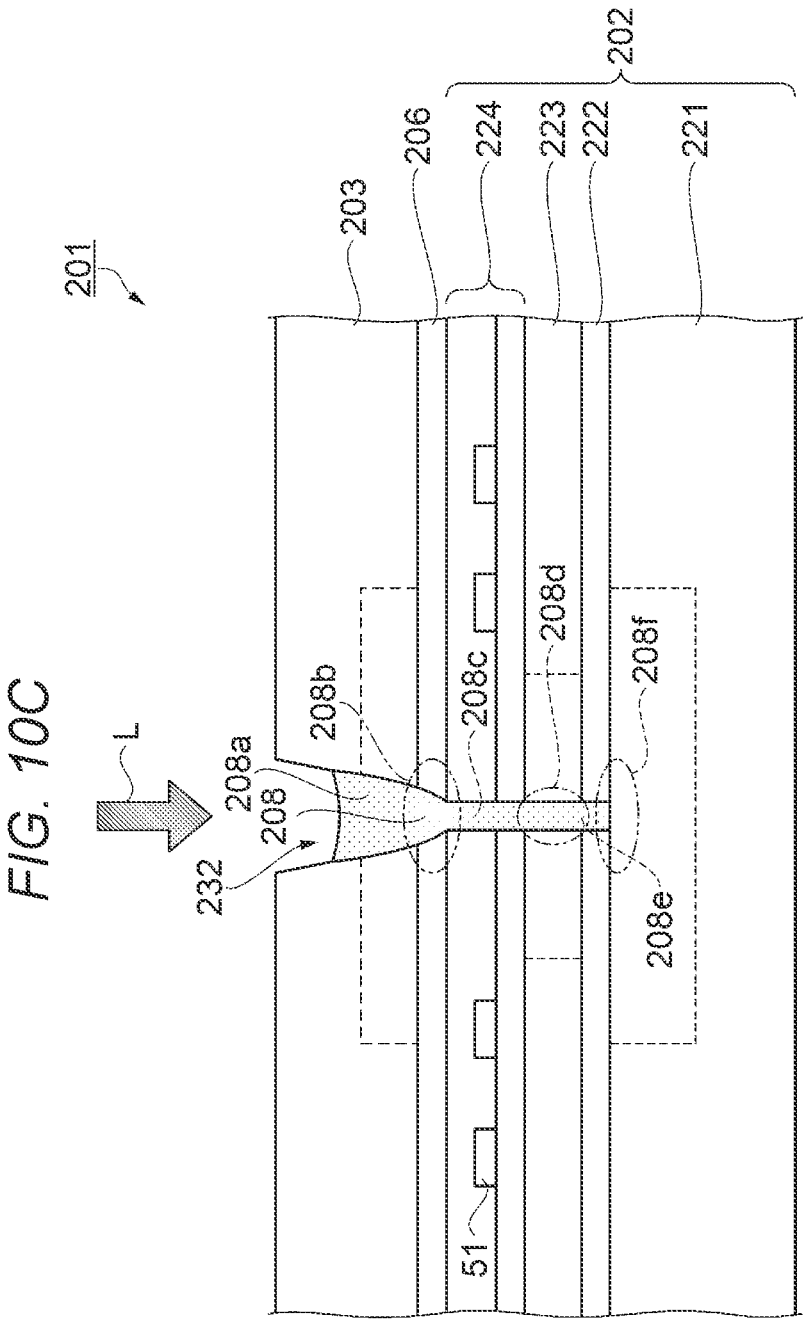
FIG. 10C
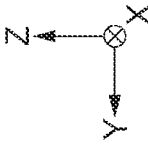

FIG. 11

INERTIAL SENSOR, METHOD FOR MANUFACTURING INERTIAL SENSOR, AND INERTIAL MEASUREMENT UNIT

The present application is based on, and claims priority from JP Application Serial Number 2022-002100, filed Jan. 11, 2022, the disclosure of which is hereby incorporated by reference herein in its entirety.

BACKGROUND

1. Technical Field

The present disclosure relates to an inertial sensor, a method for manufacturing the inertial sensor, and an inertial measurement unit including the inertial sensor.

2. Related Art

As a method for sealing a package of micro electro mechanical systems (MEMS), there is a method described in US Patent Application Publication NO. 2018/0339900. US Patent Application Publication NO. 2018/0339900 discloses a technique including a MEMS wafer and a cap wafer, in which the cap wafer is adhered to the MEMS wafer to form a cavity in which a sensor is incorporated, and thereafter, a hole that communicates with the cavity is opened in the cap wafer by emission of laser light to adjust an air pressure in the cavity, and thereafter, the laser light is emitted to the hole of the cap wafer to melt the cap wafer around the hole, thereby closing the hole.

Since the hole that communicates with the cavity is disposed above the sensor, the sensor in the cavity may be contaminated by splashes generated from the cap wafer due to emission of the laser light. Further, due to the contamination, reliability may be reduced and a yield may be reduced.

SUMMARY

An inertial sensor according to an aspect of the present application includes: a base body; a lid body forming a space between the base body and the lid body; an electrostatic capacitance element disposed in the space and made of a semiconductor layer; an adhesive layer provided in a peripheral region surrounding the space and configured to adhere the base body and the lid body to each other; and a sealer provided in the peripheral region and configured to seal a hole between the space and an outside. The sealer is provided in contact with the lid body and the base body, and includes a material of the lid body and a material of the adhesive layer.

An inertial measurement unit according to an aspect of the present application includes the inertial sensor described above; and a control circuit configured to control driving of the inertial sensor.

A method for manufacturing an inertial sensor according to an aspect of the present application, the inertial sensor including a base body, a lid body forming a space between the base body and the lid body, and an electrostatic capacitance element disposed in the space and made of a semiconductor layer, the manufacturing method includes: forming a groove communicating the space with an outside in a first surface of the lid body; adhering the lid body to the base body via an adhesive layer to form a hole communicating the space with the outside and made of the groove and the base body; and forming a sealer configured to seal the hole by a melted material of the lid body by emission of laser light toward the hole from a second surface on a side opposite to the first surface of the lid body.

A method for manufacturing an inertial sensor according to an aspect of the present application, the inertial sensor including a base body, a lid body forming a space between the base body and the lid body, and an electrostatic capacitance element disposed in the space and made of a semiconductor layer, the manufacturing method includes: forming a groove communicating the space with an outside in a third surface of the base body; adhering the lid body to a third surface of the base body via an adhesive layer to form a hole communicating the space with the outside and made of the groove and the lid body; and forming a sealer configured to seal the hole by a melted material of the lid body by emission of laser light from a lid body side toward the hole.

BRIEF DESCRIPTION OF THE DRAWINGS

FIG. 4 is a plan view of a functional element.

FIG. 9B is a diagram illustrating a manufacturing step.

FIG. 10C is a diagram illustrating a manufacturing step.

FIG. 11 is an exploded view of an inertial measurement unit of a fourth embodiment.

DESCRIPTION OF EXEMPLARY EMBODIMENTS

Hereinafter, embodiments of the present disclosure will be described with reference to the drawings.

Here, in each of the following drawings, in order to make each member have a recognizable size, a scale of each member is made different from an actual scale.

Further, in each drawing, an X axis, a Y axis, and a Z axis are shown as three axes orthogonal to one another. Further, for convenience of explanation, an end point side of an arrow indicating the Z axis is also referred to as "upper", and a start point side is also referred to as "lower". Further, hereinafter, a direction parallel to the X-axis is also referred to as an "X-axis direction", a direction parallel to the Y-axis is also referred to as a "Y-axis direction", and a direction parallel to the Z-axis is also referred to as a "Z-axis direction". Further, a plane including the X axis and the Y axis is also referred to as an "XY plane", and viewing the XY plane in the Z-axis direction is also referred to as a "plan view" or "planar". Further, viewing from a direction perpendicular to a cross section including the Z axis is also referred to as a "cross-sectional view" or "cross-sectional".

Furthermore, in the following description, for example, with respect to a substrate, description of "on a substrate" represents any one of: a case of being disposed on the substrate and in contact with the substrate, a case of being disposed on the substrate via another structure, and a case where a part is disposed on the substrate and in contact with the substrate while a part is disposed on the substrate via another structure.

1. First Embodiment

1.1 Outline of Inertial Sensor

Figure 1:
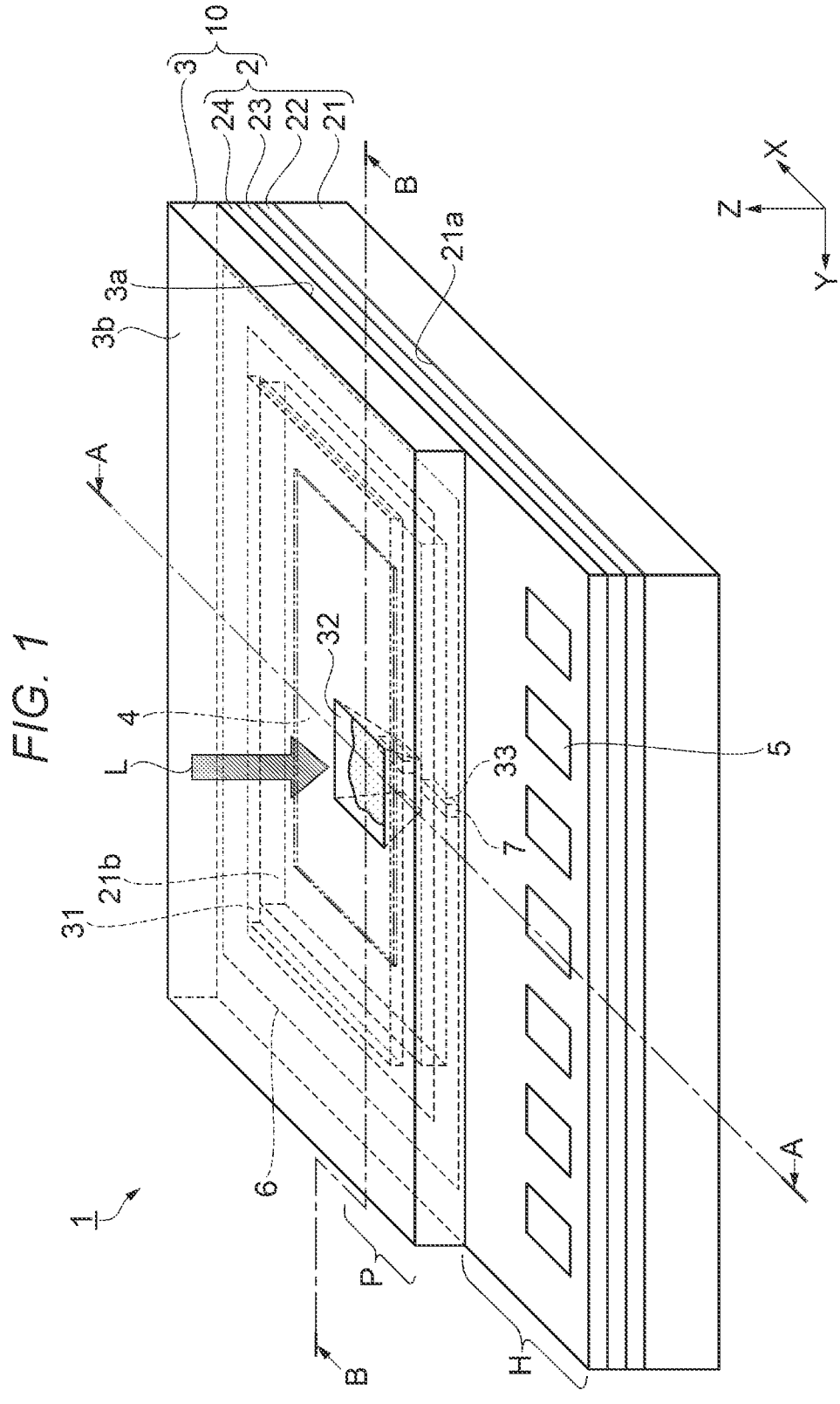
FIG. 1 is a perspective view of an inertial sensor according to a first embodiment.

FIG. 1 is an overall perspective view of an inertial sensor according to the present embodiment.

An inertial sensor 1 can be used as an angular velocity sensor that can measure an angular velocity around the Z axis (vertical axis). Such an inertial sensor 1 is configured with a package 10 in which a base body 2 and a lid body 3 are bonded to each other via an adhesive layer 6 in a peripheral region P thereof. The package 10 has a cavity S serving as a space in a region surrounded by the peripheral region P between the base body 2 and the lid body 3. The cavity S includes a functional element 4 serving as an electrostatic capacitance element formed in a semiconductor layer 23. Further, external coupling terminals 5 electrically coupled to the functional element 4 are disposed in a protrusion H of the base body 2 that protrudes from the lid body 3.

The base body 2 includes a base substrate 21 serving as a substrate, a buried insulation layer 22 serving as a second insulation layer provided on the base substrate 21, the semiconductor layer 23 provided on the buried insulation layer 22, and an insulation layer 24 serving as a first insulation layer provided on the semiconductor layer 23.

In an upper surface 3b serving as a second surface of the lid body 3, a processed portion 32 made of a recess is provided. The processed portion 32 is used to seal a hole 7 coupled to an inside of the cavity S. The hole 7 is sealed by melted silicon of the lid body 3 by emission of laser light L to the processed portion 32. Therefore, the processed portion 32 is provided at a position overlapping the hole 7 in a plan view.

The processed portion 32 is provided at a center of a long side of the peripheral region P, but is not limited thereto. The position at which the processed portion 32 is provided may be anywhere as long as it is a position overlapping the hole 7 in the peripheral region P, including corners. A part of the processed portion 32 is disposed at a position overlapping the adhesive layer 6 in a plan view such that an alloy can be formed with the adhesive layer 6 as described later. Further, the processed portion 32 may be formed in an uneven shape having a plurality of recesses. Further, the processed portion 32 may have a quadrangular shape, a polygonal shape, a circular shape, or the like in a plan view.

Figure 2:
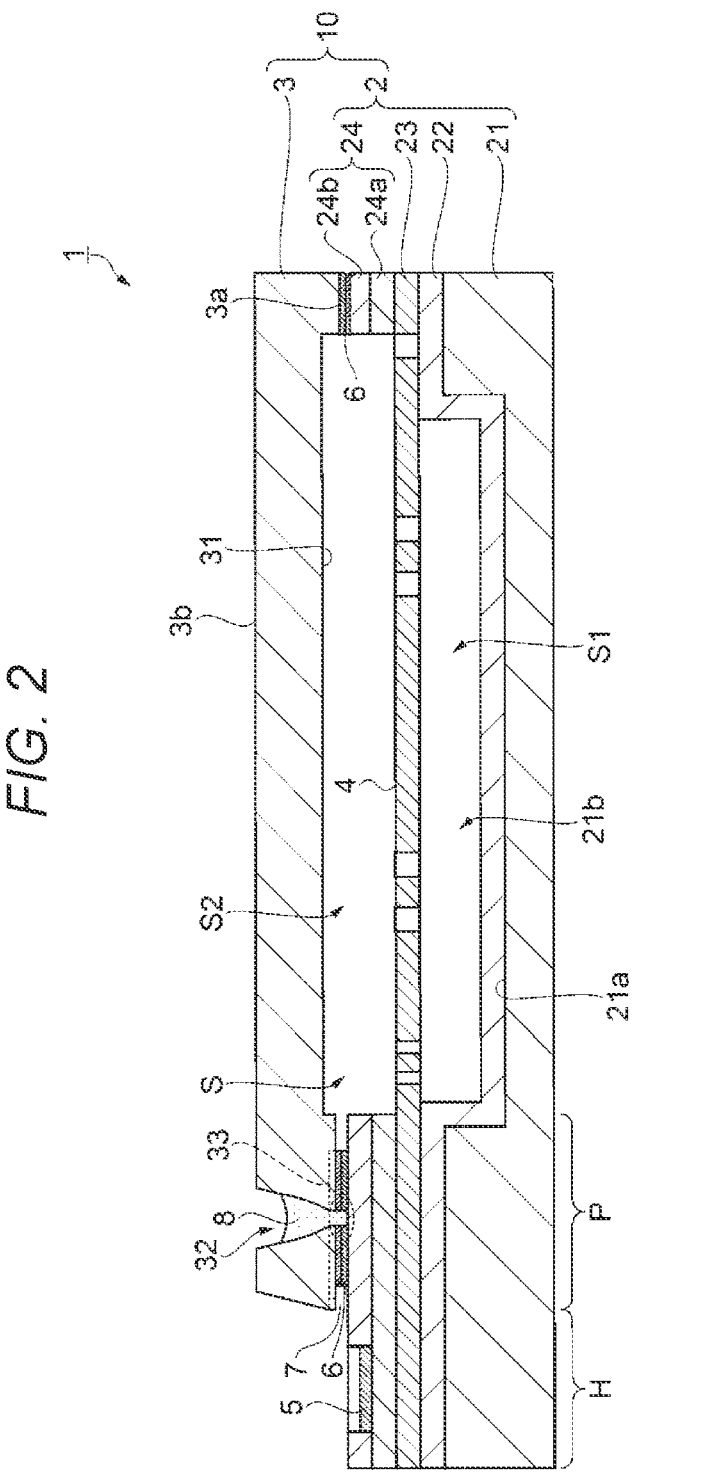
FIG. 2 is a cross-sectional view taken along a line A-A in FIG. 1.
Figure 2:
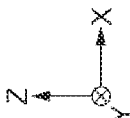
Figure 3:
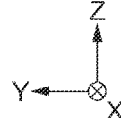
FIG. 3 is a cross-sectional view taken along a line B-B in FIG. 1.

FIG. 2 is a cross-sectional view taken along a line A-A in FIG. 1. FIG. 3 is a cross-sectional view taken along a line B-B in FIG. 1. Both FIGS. 2 and 3 are cross-sectional views cut at the position of the processed portion 32.

As shown in FIG. 2, the cavity S has a cavity silicon on insulator (SOI) structure. A recess 21b opened toward a lid body 3 side is provided in an upper surface 21a of the base substrate 21. A recess 31 opened toward a base substrate 21 side is provided in a lower surface 3a serving as a first surface of the lid body 3. The cavity S is configured with the recess 21b and the recess 31 by bonding the base body 2 and the lid body 3 via the adhesive layer 6 in the peripheral region P.

The functional element 4 such as an acceleration sensor or an angular velocity sensor is provided in the semiconductor layer 23 provided on the buried insulation layer 22. The functional element 4 is disposed in the cavity S such that a function of the functional element 4 is not limited. Therefore, a first cavity S1 made of the recess 21b is provided between the functional element 4 and the base body 2, and a second cavity S2 made of the recess 31 is provided between the functional element 4 and the lid body 3. In the present embodiment, the buried insulation layer 22 is provided on the recess 21b, but the buried insulation layer 22b may be removed as appropriate during a manufacturing step.

The insulation layer 24 disposed on the semiconductor layer 23 has a laminated structure including an insulation layer 24a and an insulation layer 24b, and the external coupling terminals 5 and a wiring layer 51 are provided between the insulation layer 24a and the insulation layer 24b. Further, a metal wiring layer (not shown) that couples the functional element 4 and the external coupling terminals 5 is also provided between the insulation layer 24a and the insulation layer 24b.

A groove 33 that communicates an inner side of the recess 31 with an outer side of the recess 31 is provided in the peripheral region P of the lid body 3. When the base body 2 and the lid body 3 are pasted by the adhesive layer 6, in the groove 33, a hole 7 that communicates an inner side of the cavity S with an outer side of the cavity S is formed by the adhesive layer 6 and the insulation layer 24b disposed below the groove 33, that is, on an opening side of the groove 33.

As shown in FIG. 3, the adhesive layer 6 is configured with a first adhesive layer 6a provided on a base body 2 side and a second adhesive layer 6b provided on the lid body 3 side. The first adhesive layer 6a and the second adhesive layer 6b are heated and pressurized by using a thermocompression-bonding method, whereby the first adhesive layer 6a and the second adhesive layer 6b are adhered and the adhesive layer 6 is formed.

Materials of outermost surfaces of the first adhesive layer 6a and the second adhesive layer 6b may be those that form a eutectic composition by thermocompression-bonding. Preferably, the outermost surface of the first adhesive layer 6a can be made of aluminum AL, and the outermost surface of the second adhesive layer 6b can be made of germanium Ge. Each of the first adhesive layer 6a and the second adhesive layer 6b may be a multilayer film, and for example, may include a barrier layer made of titanium tungsten TiW.

The hole 7 is provided to adjust an air pressure in the cavity S. After the air pressure in the cavity S is adjusted, the hole 7 is sealed by a sealer 8. Accordingly, the cavity S is hermetically sealed. When the functional element 4 is the angular velocity sensor element, in order to efficiently vibrate the functional element 4, the cavity S may be in a vacuum state, for example, a reduced pressure state of 10 Pa or less. Further, when the functional element 4 is the acceleration sensor element, in order to cause the functional element 4 to sufficiently exhibit a damping effect, the cavity S may be substantially in an atmospheric pressure state. Further, an inside of the cavity S may be replaced with an inert gas such as helium, argon, or nitrogen.

The sealer 8 is provided by melting the lid body 3 made of the silicon substrate by emission of the laser light L. When emitting the laser light L to the processed portion 32 from above the lid body 3, the lid body 3 between the processed portion 32 and the base body 2, including a wall of the groove 33, melts, and the melted silicon buries the groove 33, and penetrates the adhesive layer 6 to adhere to the insulation layer 24*b* of the base body 2. Accordingly, the sealer 8 seals the hole 7. The sealer 8 is provided in contact with the lid body 3 and the base body 2. That is, the sealer 8 is provided in contact with the base body 2 without sandwiching the cavity S, so that as compared with a case where the cavity S is sandwiched, it is possible to prevent the melted silicon from scattering.

The sealer 8 includes a first portion 8*a* serving as a first sealer that buries the groove 33 on the lid body 3 side, and a second portion 8*b* serving as a second sealer in contact with the insulation layer 24*b* of the base body 2.

The first portion 8*a* is a portion using the silicon of the lid body 3 melted by emission of the laser light L as a main component. Since an inner wall of the groove 33 is also melted by emission of the laser light L, an interface between the first portion 8*a* and the groove 33 is formed in a state where there is no interface or a state where it is difficult to check the interface. Therefore, the configuration of the first portion 8*a* is highly effective in preventing entry of moisture from an outside into the cavity S along the interface.

The second portion 8*b* is a portion made of an alloy of the silicon of the lid body 3 and a metal of the adhesive layer 6. The second portion 8*b* is the alloy of the silicon and the adhesive layer 6, so that adhesiveness to the insulation layer 24*b* made of silicon oxide is good, and a void is difficult to occur at an interface with the insulation layer 24*b*. Therefore, a leak path is unlikely to be formed at the interface between the sealer 8 and the insulation layer 24*b*, and it is possible to prevent the moisture from entering the cavity S over a long period of time.

In this way, the sealer 8 can prevent the moisture from entering the cavity S over a long period of time. Therefore, it is possible to provide an inertial sensor that can maintain reliability over a long period of time by preventing sticking of an acceleration sensor and a decrease in a Q value of an angular velocity sensor caused by the entry of the moisture.

The base substrate 21 is formed of a glass material containing movable ions made of alkali metal ions, for example, borosilicate glass such as Pyrex (registered trademark) glass. Accordingly, the functional element 4 formed of the silicon substrate can be firmly bonded to the base substrate 21 by anodic bonding. The constituent material of the base substrate 21 is not limited to the glass material, for example, a silicon material having high resistance can be used. In this case, the bonding to the functional element 4 can be performed via, for example, a resin-based adhesive, a glass paste, a metal layer, or the like.

1.2 Outline of Functional Element

Figure 4:
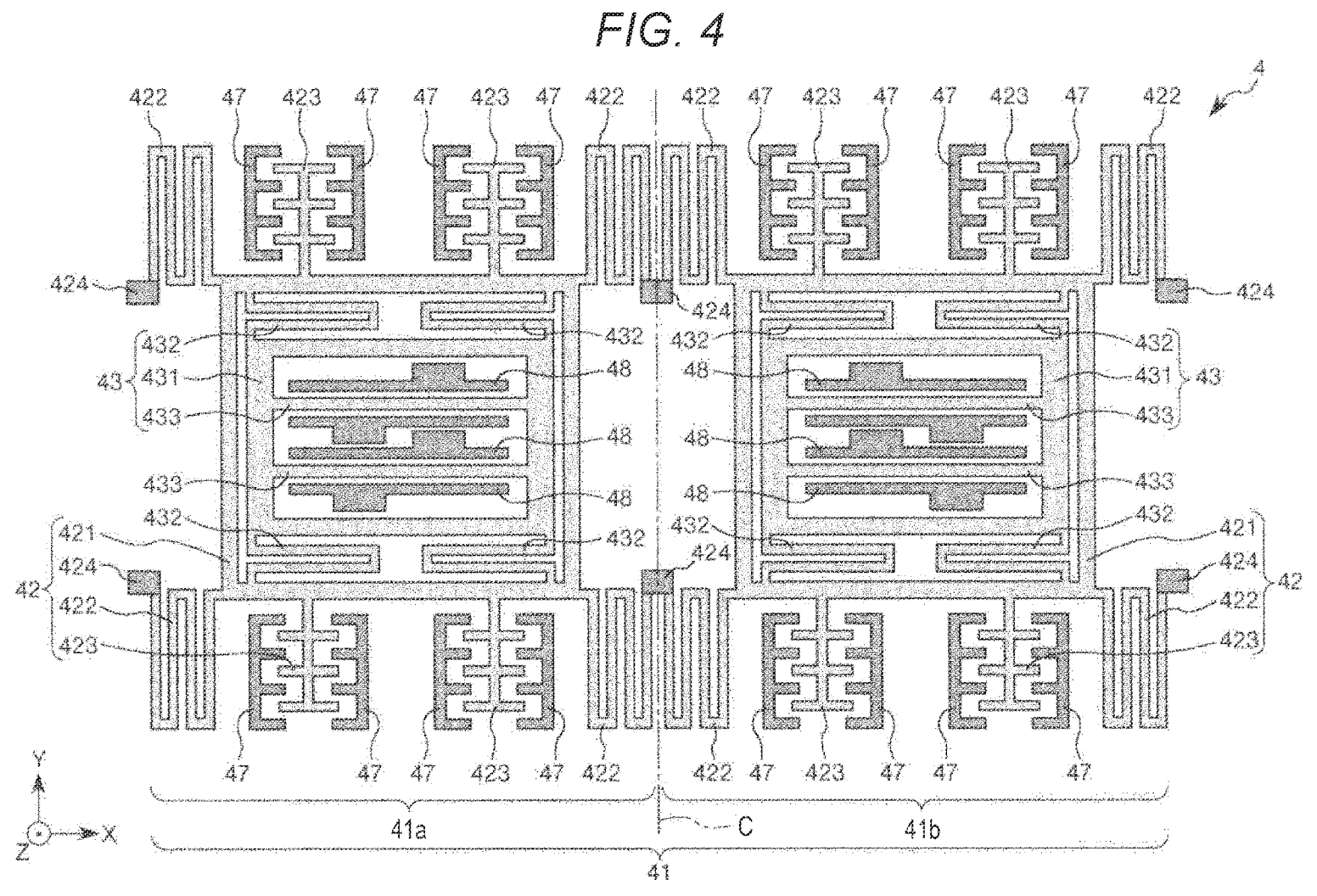

FIG. 4 is a plan view of the functional element. FIG. 4 shows a configuration of the angular velocity sensor element for detecting an angular velocity around the Z axis as the functional element.

The functional element 4 includes a structure 41, driving fixed electrodes 47, and detection fixed electrodes 48.

The structure 41 includes two vibration bodies 41*a* and 41*b*. These vibration bodies 41*a* and 41*b* are coupled to each other along the X-axis direction. Further, the vibration bodies 41*a* and 41*b* are provided symmetrically with respect to a boundary line C therebetween. Hereinafter, since configurations of the vibration bodies 41*a* and 41*b* are the same as each other, in the following description, the configuration of the vibration body 41*a* will be representatively described, and description of the configuration of the vibration body 41*b* is omitted.

The vibration body 41*a* includes a driver 42 and a detector 43. Further, the driver 42 includes a driving supporter 421, driving springs 422, driving movable electrodes 423, and fixers 424.

The driving supporter 421 has a frame shape, and is coupled to the fixers 424 fixed to the upper surface 21*a* of the base substrate 21 via the driving springs 422.

The driving spring 422 can be elastically deformed in the X-axis direction. Accordingly, the driving supporter 421 can be vibrated in the X-axis direction with respect to the fixers 424.

The driving movable electrode 423 is coupled to the driving supporter 421, and is positioned on an outer side of the driving supporter 421. The driving fixed electrodes 47 fixed to the upper surface 21*a* of the base substrate 21 are positioned to face each other via the driving movable electrode 423. Therefore, when a voltage is applied between the driving fixed electrodes 47 and the driving movable electrode 423, an electrostatic force is generated between the driving fixed electrodes 47 and the driving movable electrode 423. By the electrostatic force, it is possible to vibrate the driving supporter 421 along the X-axis direction while elastically deforming the driving springs 422.

The detector 43 is disposed inside the driving supporter 421, and includes a detection supporter 431, detection springs 432, and detection movable electrodes 433.

The detection supporter 431 has a frame shape, and is coupled to the driving supporter 421 via the detection springs 432.

The detection spring 432 can be elastically deformed in the Y-axis direction. Accordingly, the detection supporter 431 can be displaced in the Y-axis direction with respect to the driving supporter 421.

The detection movable electrode 433 extends in the X-axis direction inside the detection supporter 431. Both end portions of the detection movable electrode 433 are coupled to the detection supporter 431. The detection fixed electrodes 48 fixed to the upper surface 21*a* of the base substrate 21 are positioned to face each other via the detection movable electrode 433. Therefore, when the detection supporter 431 is vibrated in the Y-axis direction while elastically deforming the detection springs 432, a gap between the detection fixed electrode 48 and the detection movable electrode 433 changes, and an electrostatic capacitance between the detection fixed electrode 48 and the detection movable electrode 433 changes along with the change.

The functional element 4 having such a configuration detects an angular velocity around the Z axis as follows.

First, the driving supporter 421 is vibrated along the X-axis direction by applying a voltage between the driving fixed electrodes 47 and the driving movable electrode 423. At this time, the driving supporters 421 of the vibration bodies 41*a* and 41*b* are vibrated in mutually opposite phases.

In this way, when an angular velocity ω around the Z axis is applied to the functional element 4 in a state where the driving supporters 421 of the vibration bodies 41*a* and 41*b* are vibrated, a Coriolis force works, and the detection supporters 431 of the vibration bodies 41*a* and 41*b* are displaced in the Y-axis direction with respect to the driving supporters 421. At this time, the detection supporters 431 of the vibration bodies 41*a* and 41*b* are displaced in mutually opposite phases.

The detection supporter 431 is displaced in the Y-axis direction with respect to the driving supporter 421, so that the gap between the detection movable electrode 433 and the detection fixed electrode 48 changes, and the electrostatic capacitance between the detection movable electrode 433 and the detection fixed electrodes 48 changes according to the change in the gap.

Therefore, the functional element 4 can detect a change amount of the electrostatic capacitance between the detection movable electrode 433 and the detection fixed electrodes 48 by applying a voltage therebetween, and calculate the angular velocity ω around the Z axis based on the change amount of the electrostatic capacitance.

1.3 Outline of Method for Manufacturing Inertial Sensor

Figure 5:
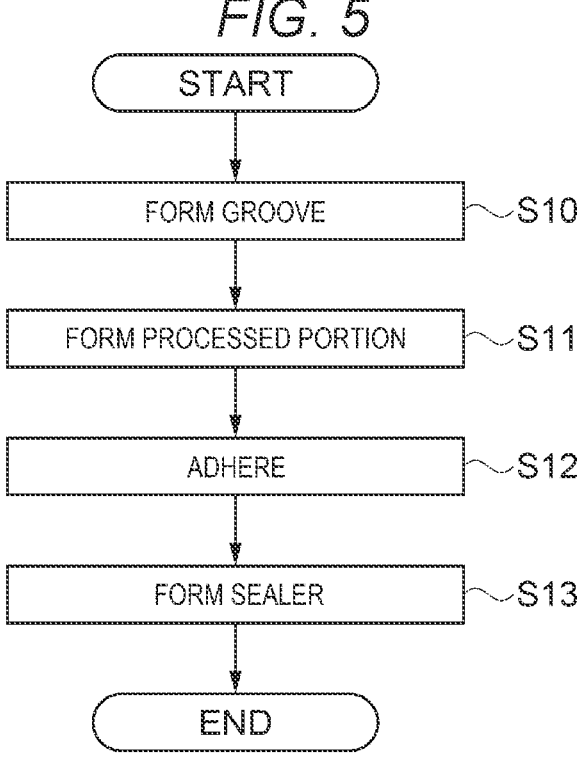
FIG. 5 is a flowchart illustrating a method for manufacturing the inertial sensor.

FIG. 5 is a flowchart illustrating a method for manufacturing the inertial sensor. FIGS. 6A, 6B, 7A, and 7B are diagrams illustrating manufacturing steps shown in the flowchart of FIG. 5.

Figure 6A:
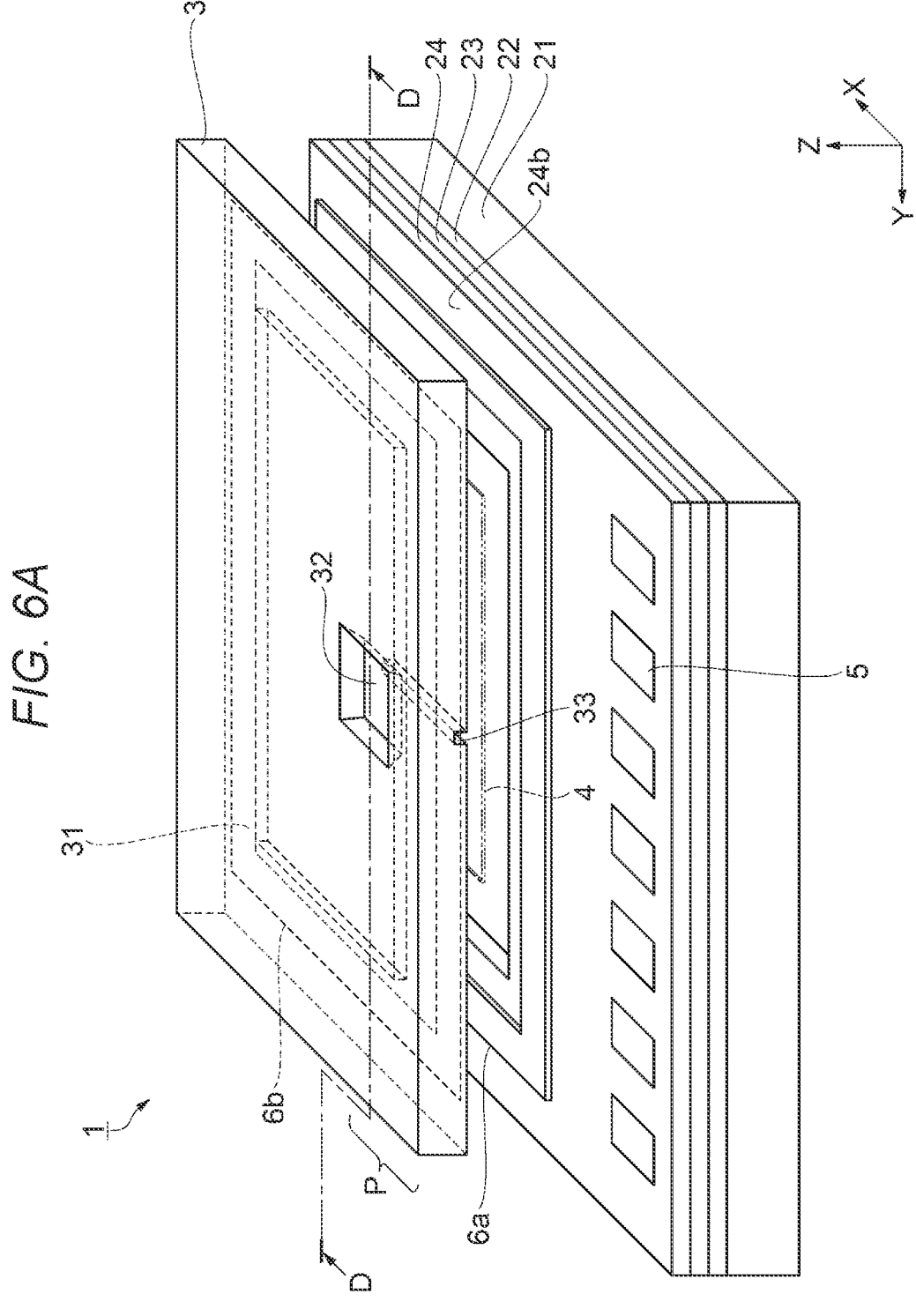
FIG. 6A is a diagram illustrating a manufacturing step.
Figure 6B:
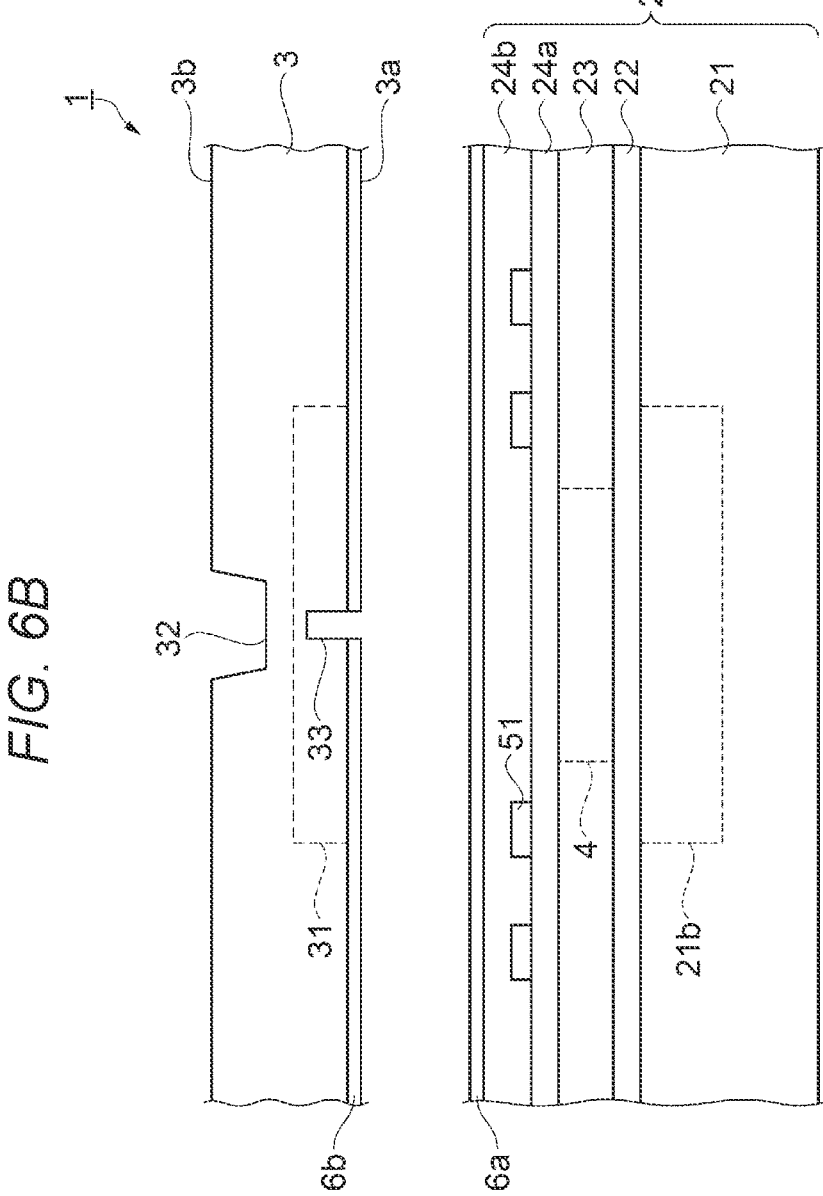
FIG. 6B is a cross-sectional view taken along a line D-D in FIG. 6A.
Figure 7A:
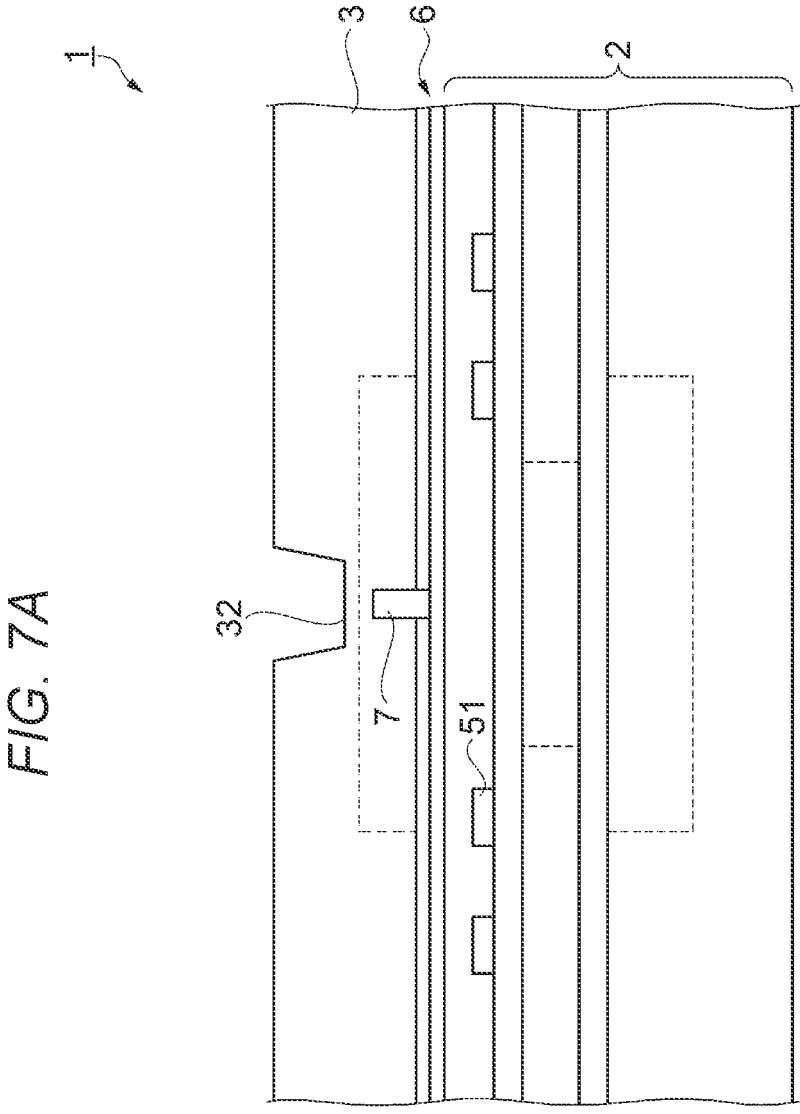
FIG. 7A is a diagram illustrating a manufacturing step.
Figure 7B:
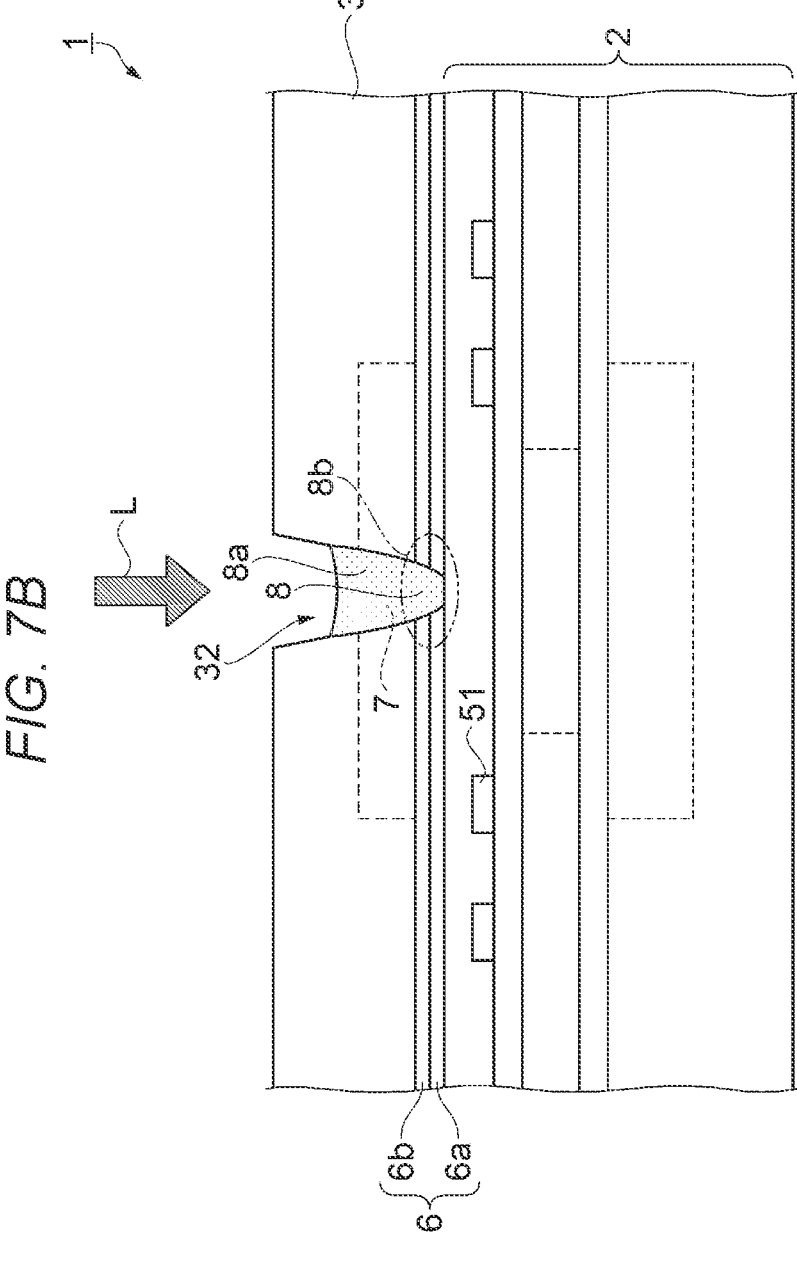
FIG. 7B is a diagram illustrating a manufacturing step.

FIG. 6A is a perspective view showing the inertial sensor before the base body 2 and the lid body 3 are bonded to each other. FIG. 6B is a cross-sectional view taken along a line D-D in FIG. 6A. Further, FIG. 7A is a cross-sectional view of the inertial sensor taken along the line D-D when the base body 2 and the lid body 3 are bonded to each other. FIG. 7B is a cross-sectional view of the inertial sensor taken along the line D-D showing a state where the sealer 8 is formed by emission of the laser light L.

As shown in FIG. 6B, the first adhesive layer 6a is provided on the insulation layer 24b in the peripheral region P of the base body 2, and the second adhesive layer 6b is provided on the lower surface 3a facing the lid body 3. Further, the wiring layer 51 is provided between the insulation layer 24a and the insulation layer 24b.

In the flowchart of FIG. 5, in step S10, the groove 33 is formed in the lower surface 3a of the lid body 3. As shown in FIG. 6A, the groove 33 communicates the inner side of the recess 31 provided in the lid body 3 with the outer side of the recess 31. The groove 33 is not limited to a case where the inner side and the outer side of the recess 31 are linearly coupled. For example, there may be a curved portion or a bent portion in the middle.

In step S11, the recess serving as the processed portion 32 is formed. As shown in FIG. 6B, the processed portion 32 is provided at the position overlapping the groove 33 in a plan view in the upper surface 3b of the lid body 3. In the present embodiment, a shape of the processed portion 32 is a truncated square pyramid, but the shape of the processed portion 32 is not limited thereto, and may be, for example, a truncated polygonal pyramid, a truncated cone, or a cylindrical shape.

In step S12, the base body 2 and the lid body 3 are adhered to each other. As shown in FIG. 7A, the base body 2 and the lid body 3 are adhered to each other by the adhesive layer 6. The adhesive layer 6 adheres the base body 2 and the lid body 3 by the eutectic layer formed by thermocompression-bonding the first adhesive layer 6a and the second adhesive layer 6b.

Since the base body 2 and the lid body 3 are adhered to each other, the hole 7 that communicates the inside of the cavity S with the outer side is formed from the groove 33 and the base body 2. After the air pressure of the cavity S is adjusted using the hole 7, the hole 7 is sealed by the sealer 8.

In step S13, the sealer 8 is formed. As shown in FIG. 7B, the silicon of the lid body 3 between the processed portion 32 and the groove 33 and the silicon for forming the inner wall of the groove 33 are melted by emission of the laser light L to the processed portion 32 provided in the peripheral region P of the lid body 3. The melted silicon buries the groove 33, penetrates the adhesive layer 6, adheres to the insulation layer 24b of the base body 2, and forms the sealer 8. The sealer 8 is provided on the base body 2 side of the lid body 3. The sealer 8 is provided in contact with the lid body 3 and the base body 2. That is, the sealer 8 is provided in contact with the base body 2 without sandwiching the cavity S, so that as compared with the case where the cavity S is sandwiched, it is possible to prevent the melted silicon from scattering.

In the sealer 8, the portion that buries the groove 33 is the first portion 8a serving as the first sealer. As described above, the first portion 8a is formed in the state where there is no interface between the groove 33 and the first portion 8a or the state where it is difficult to check the interface.

In the sealer 8, the portion that adheres to the insulation layer 24b is the second portion 8b serving as the second sealer. The second portion 8b is the alloy of the melted silicon and the adhesive layer 6. The second portion 8b contains the metal melted from the first adhesive layer 6a overlapping the groove 33 and the second adhesive layer 6b exposed to the inner wall of the groove 33. Accordingly, the lid body 3 and the adhesive layer 6 are electrically conducted via the first portion 8a and the second portion 8b. Accordingly, excessive electric charges accumulated in the adhesive layer 6 can be released to the lid body 3, and malfunction can be prevented.

Since the sealer 8 that seals the hole 7 is provided in the peripheral region P of the cavity S, even if the laser light L is emitted to the lid body 3 in order to form the sealer 8, the melted silicon can prevent the functional element 4 from being contaminated.

As described above, according to the inertial sensor 1 of the present embodiment, the following effects can be obtained.

The inertial sensor 1 of the present embodiment includes: the base body 2; the lid body 3 that forms the cavity S serving as the space between the base body 2 and the lid body 3; the functional element 4 that is disposed in the cavity S and that serves as the electrostatic capacitance element made of the semiconductor layer 23; the adhesive layer 6 that is provided in the peripheral region P which surrounds the cavity S and that adheres the base body 2 and the lid body 3 to each other; and the sealer 8 that is provided in the peripheral region P and seals the hole 7 between the cavity S and the outside. The sealer 8 is provided in contact with the lid body 3 and the base body 2, and includes the material of the lid body 3 and the material of the adhesive layer 6.

According to the configuration, since the sealer 8 that seals the hole 7 is provided in the peripheral region P of the cavity S, even if the hole 7 is sealed by the sealer 8 including the material of the lid body 3, it is possible to prevent the functional element 4 disposed in the cavity S from being contaminated. Further, the sealer 8 includes the material of the lid body 3 and the material of the adhesive layer 6, so that the adhesiveness is excellent, and it is possible to prevent the void from being generated at the interface between the sealer 8 and the hole 7 and prevent the leak path from being formed.

Therefore, when the inertial sensor according to the present embodiment is applied to the acceleration sensor, it is possible to prevent the sticking of the functional element 4 caused by the entry of the moisture, and to provide a highly reliable acceleration sensor. Further, when the inertial sensor of the present embodiment is applied to the angular velocity sensor, it is possible to provide an angular velocity sensor that can prevent the decrease in the Q value of the angular velocity sensor caused by entry of the moisture or the air and can maintain reliability over a long period of time.

Further, in the inertial sensor 1 according to the present embodiment, the base body 2 includes the base substrate 21 serving as the substrate, and the insulation layer 24 serving as the first insulation layer provided between the base substrate 21 and the lid body 3. The hole 7 is provided in the lid body 3, and includes the groove 33 opened toward the base body 2. The sealer 8 is in contact with the insulation layer 24.

According to the configuration, the hole 7 includes the groove 33 provided in the lid body 3, and the sealer 8 buries the groove 33 and is in contact with the insulation layer 24, so that a good adhesion surface can be formed between the sealer 8 and the insulation layer 24.

Further, in the inertial sensor 1 according to the present embodiment, the lid body 3 includes the processed portion 32 having the recess at the position overlapping the sealer 8 in a plan view.

According to the configuration, since the processed portion 32 is provided in a shape having the recess, the silicon of the lid body 3 of the processed portion 32 is easily melted by emission of the laser light L. Therefore, a processing time can be shortened, and processing quality can be improved.

Further, the recess 32 of the lid body 3 is disposed at the position overlapping the adhesive layer 6 in a plan view, which makes it easy for the sealer 8 to form an alloy with the adhesive layer 6. Therefore, the sealer 8 can implement good sealing performance.

The method for manufacturing the inertial sensor 1 according to the present embodiment is a method for manufacturing the inertial sensor 1 including: the base body 2; the lid body 3 that forms the cavity S serving as the space between the base body 2 and the lid body 3; and the functional element 4 that is disposed in the cavity S and that serves as the electrostatic capacitance element made of the semiconductor layer 23. The manufacturing method includes: the step S10 of forming the groove 33 that communicates the cavity S with the outside in the lower surface 3*a* serving as the first surface of the lid body 3; the step S12 of adhering the lower surface 3*a* of the lid body 3 to the base body 2 via the adhesive layer 6 to form the hole 7 that communicates the cavity S with the outside and that is made of the groove 33 and the base body 2; and the step S13 of forming the sealer 8 that seals the hole 7 by the melted material of the lid body 3 by emission of the laser light L toward the hole 7 from the upper surface 3*b* serving as the second surface on a side opposite to the lower surface 3*a* of the lid body 3.

According to the configuration, the base body 2 and the lid body 3 are adhered to form the hole 7 by the groove 33 provided in the lid body 3 and the base body 2, and the hole 7 is sealed by the silicon obtained by melting the lid body 3, so that the melted silicon and the hole 7 can form a good adhesion surface. Therefore, it is possible to prevent the void from being generated at the interface between the sealer 8 and the hole 7, and to prevent the leak path from being formed. Further, the sealing of the hole 7 can prevent the functional element 4 disposed in the cavity S from being contaminated.

The method for manufacturing the inertial sensor 1 according to the present embodiment further includes the step S11 of forming the processed portion 32 made of the recess at the position overlapping the groove 33 of the lid body 3. In the step S13 of forming the sealer 8, by emitting the laser light L to the processed portion 32, the first portion 8*a* serving as the first sealer made of the material of the lid body 3 and the second portion 8*b* serving as the second sealer made of the material of the lid body 3 and the material of the adhesive layer 6 are formed.

According to the configuration, the processed portion 32 to which the laser light L is emitted has the shape of the recess, so that the silicon of the lid body 3 is easily melted by emission of the laser light L. Therefore, the processing time can be shortened, and the processing quality can be improved.

2. Second Embodiment

In a second embodiment, an inertial sensor 101 according to another embodiment of the inertial sensor 1 according to the first embodiment will be described. In the following description, the same configurations and steps as those of the first embodiment will be denoted by the same reference numerals, and repeated description is omitted.

FIGS. 8A, 8B, 9A, and 9B are diagrams illustrating manufacturing steps of the inertial sensor according to the second embodiment.

Figure 8A:
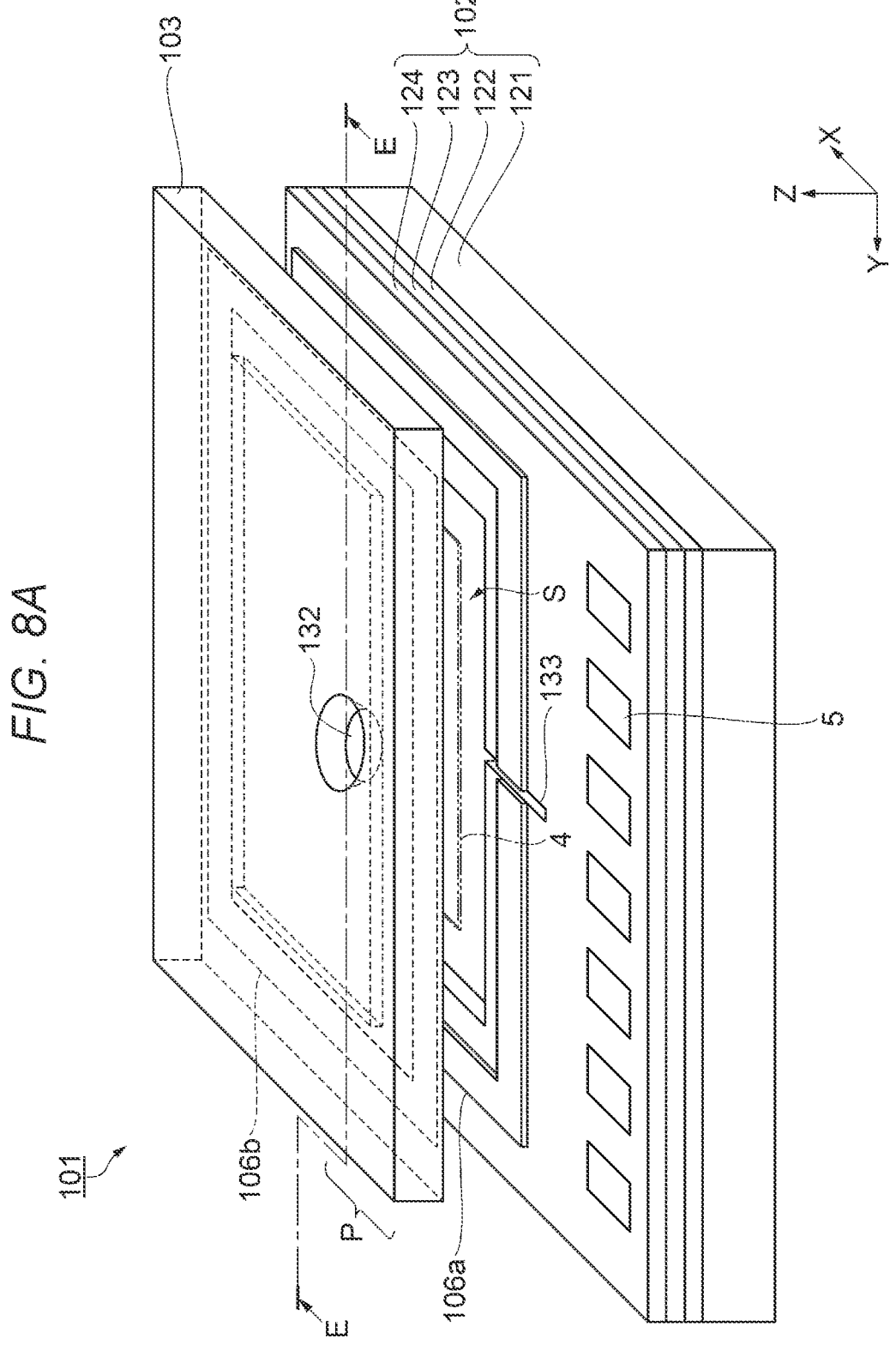
FIG. 8A is a diagram illustrating a manufacturing step of a second embodiment.
Figure 8B:
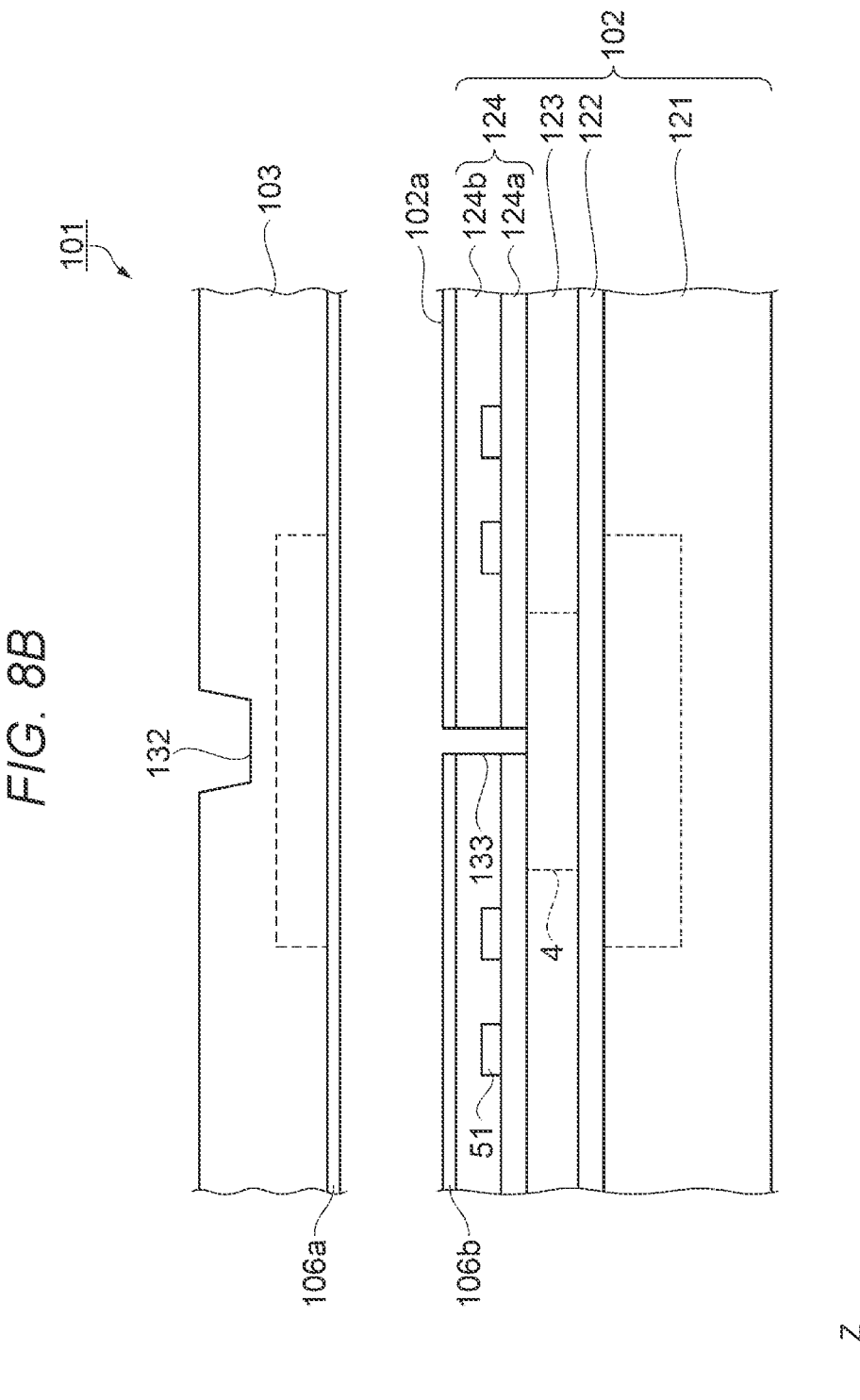
FIG. 8B is a cross-sectional view taken along a line E-E in FIG. 8A.
Figure 9A:
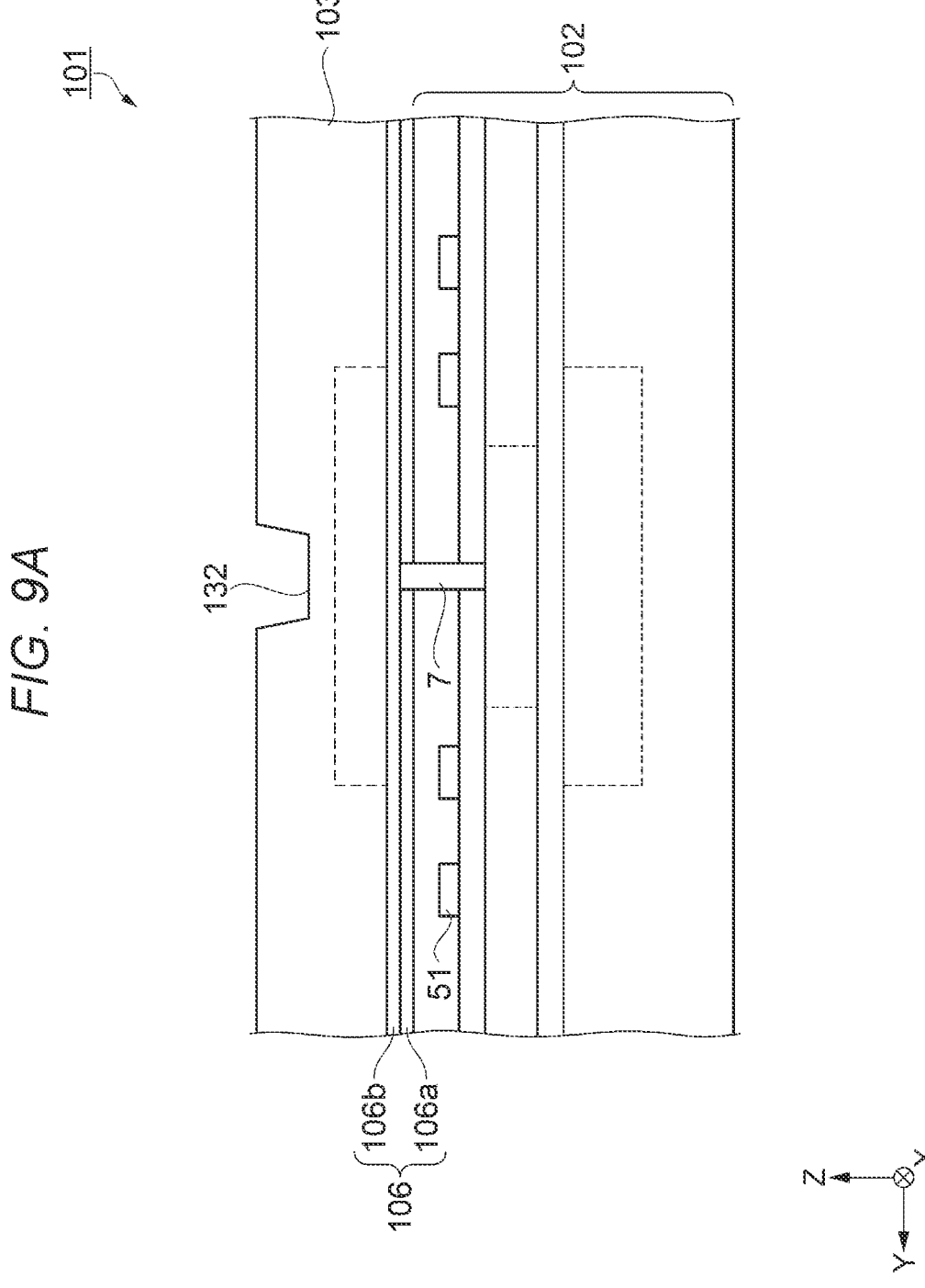
FIG. 9A is a diagram illustrating a manufacturing step.

FIG. 8A is a perspective view showing the inertial sensor 101 before a base body 102 and a lid body 103 are bonded to each other. FIG. 8B is a cross-sectional view taken along a line E-E in FIG. 8A. Further, FIG. 9A is a cross-sectional view of the inertial sensor 101 taken along the line E-E when the base body 102 and the lid body 103 are bonded to each other. FIG. 9B is a cross-sectional view of the inertial sensor 101 taken along the line E-E showing a state where a sealer 108 is formed by emission of the laser light L.

As shown in FIGS. 8A and 8B, in the inertial sensor 101 according to the second embodiment, a groove 133 is provided in an upper surface 102*a* serving as a third surface of the base body 102. The groove 133 is provided in an insulation layer 124 of the base body 102, exposes insulation layers 124*a* and 124*b* to an inner wall, and exposes a semiconductor layer 123 to a bottom of the groove 133. The groove 133 crosses the peripheral region P, and communicates an inner side of the cavity S with an outside.

Further, a processed portion 132 made of a recess is provided at a position overlapping the groove 133 in a plan view in the peripheral region P. In the present embodiment, the processed portion 132 is provided in a truncated cone shape or a cylindrical shape. Further, a part of the processed portion 132 is disposed at a position overlapping an adhesive layer 106 in a plan view.

As shown in FIG. 9A, the base body 102 and the lid body 103 are thermocompression-bonded in a similar manner as in the first embodiment, and a first adhesive layer 106*a* and a second adhesive layer 106*b* form the adhesive layer 106. In the present embodiment, an outermost surface of the first adhesive layer 106*a* on a base body 102 side is germanium Ge, and an outermost surface of the second adhesive layer 106*b* on a lid body 103 side is germanium Ge. When a polysilicon layer is used as a wiring layer on the base body 102 side, a conductive layer of the base body 102 is made of only silicon, so that a clean element can be formed.

The groove 133 and the lid body 103 form the hole 7 by adhering the base body 102 and the lid body 103 to each other.

As shown in FIG. 9B, the laser light L is emitted to the processed portion 132 to form the sealer 108. The laser light L is emitted to the processed portion 132 from above the lid body 103, so that silicon of the lid body 103 between the processed portion 132 and the groove 133 is melted. The melted silicon penetrates the adhesive layer 106, buries the groove 133, and reaches the semiconductor layer 123, so that the sealer 108 is formed. The sealer 108 is provided in contact with the base body 102 and the lid body 103. That is, since the sealer 108 is provided in contact with the base body 102 without sandwiching the cavity S, as compared with a case where the cavity S is sandwiched, it is possible to prevent the melted silicon from scattering.

The sealer 108 includes a first portion 108a, a second portion 108b, a third portion 108c, and a fourth portion 108d.

The first portion 108a is a portion melted by emission of the laser light L on the lid body 103 side.

The second portion 108b is a portion made of an alloy formed of the melted silicon and the adhesive layer 106 when penetrating the adhesive layer 106.

The third portion 108c is a portion that buries the groove 133 provided in the insulation layer 124. Since the insulation layers 124a and 124b exposed to the inner wall of the groove 133 are both formed of silicon oxide films, the insulation layers 124a and 124b have good compatibility with the third portion 108c using the melted silicon as a main component. Therefore, the third portion 108c is formed in a state where there is no interface between the melted silicon and the insulation layer 124 or a state where it is difficult to check the interface.

The fourth portion 108d is a portion where the silicon melted from the lid body 103 reaches the semiconductor layer 123, melts a surface of the semiconductor layer 123, and adheres to the semiconductor layer 123. Since the semiconductor layer 123 is also made of silicon, the fourth portion 108d is formed in a state where there is no interface between the melted silicon and the semiconductor layer 123 or a state where it is difficult to check the interface.

Therefore, similar to the first embodiment, the sealer 108 can also be configured to have a high effect of preventing entry of moisture from an outside into the cavity S along the interface.

Since the sealer 108 is in contact with the lid body 103 and the semiconductor layer 123 via the first portion 108a to the fourth portion 108d, electrical conduction can be established between the lid body 103 and the semiconductor layer 123. Accordingly, excessive electric charges accumulated in the semiconductor layer 123 can be released to the lid body 103, and malfunction can be prevented.

As described above, according to the inertial sensor 101 according to the present embodiment, the following effects can be obtained in addition to the effects of the first embodiment.

In the inertial sensor 101 according to the present embodiment, the base body 102 further includes a base substrate 121 serving as the substrate; the insulation layer 124 serving as the first insulation layer provided between the base substrate 121 and the lid body 103; and the semiconductor layer 123 provided between the base substrate 121 and the insulation layer 124. The hole 7 is provided in the insulation layer 124, and includes the groove 133 opened toward the lid body 103. The sealer 108 is in contact with the semiconductor layer 123.

According to the configuration, the hole 7 includes the groove 133 provided in the insulation layer 124 of the base body 102, and the sealer 108 buries the groove 133 and is in contact with the semiconductor layer 123, so that a good adhesion surface can be formed between the sealer 108 and the insulation layer 124 as well as the semiconductor layer 123.

Further, in the inertial sensor 101 according to the present embodiment, the lid body 103 and the semiconductor layer 123 are electrically coupled to each other via the sealer 108.

According to the configuration, there is no need to provide separate wiring to conduct the lid body 103 and the semiconductor layer 123. Therefore, it is possible to reduce the number of components, the number of steps, and a cost, and to improve reliability.

The method for manufacturing the inertial sensor 101 according to the present embodiment is a method for manufacturing the inertial sensor 101 including: the base body 102; the lid body 103 that forms the cavity S serving as the space between the base body 102 and the lid body 103; and the functional element 4 that is disposed in the cavity S and that serves as the electrostatic capacitance element made of the semiconductor layer 123. The manufacturing method includes: the step S10 of forming the groove 133 that communicates the cavity S with the outside in the upper surface 102a serving as the third surface of the base body 102; the step S12 of adhering the lid body 103 to the upper surface 102a of the base body 102 via the adhesive layer 106 to form the hole 7 that communicates the cavity S with the outside and that is made of the groove 133 and the lid body; and the step S13 of forming the sealer 108 that seals the hole 7 by the melted material of the lid body 103 by emission of the laser light L from the lid body 103 side toward the hole 7.

According to the configuration, the base body 102 and the lid body 103 are adhered to form the hole 7 by the groove 133 provided in the base body 102 and the lid body 103, and the hole 7 is sealed by the silicon obtained by melting the lid body 103, so that the melted silicon and the hole 7 can form a good adhesion surface. Therefore, it is possible to prevent the void from being generated at the interface between the sealer 108 and the hole 7, and to prevent the leak path from being formed. Further, the sealing of the hole 7 can prevent the functional element 4 disposed in the cavity S from being contaminated.

3. Third Embodiment

In a third embodiment, an inertial sensor 201 according to still another embodiment will be described. In the following description, the same configurations and steps as those of the first embodiment will be denoted by the same reference numerals, and repeated description is omitted.

Figure 10A:
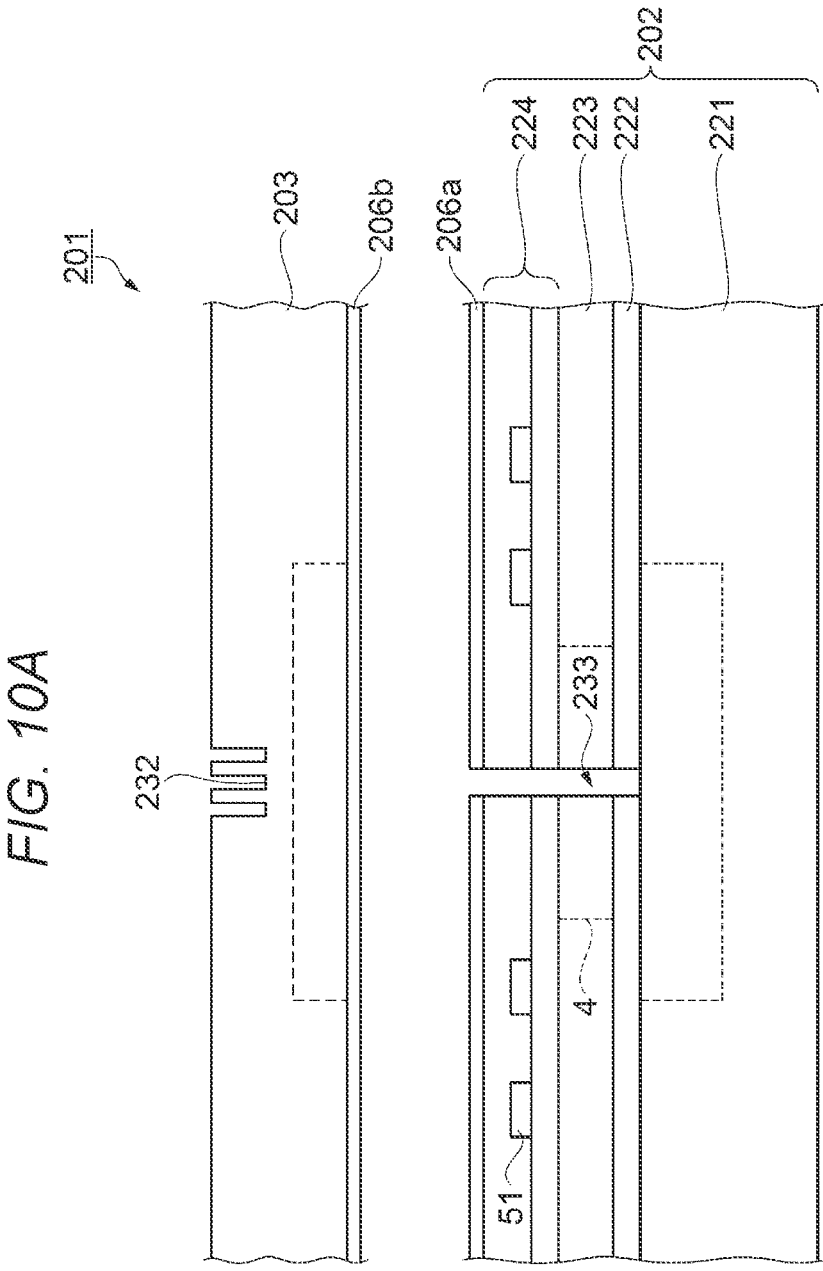
FIG. 10A is an illustrative diagram corresponding to a manufacturing step of a third embodiment.
Figure 10A:
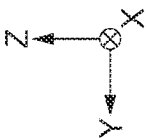
Figure 10B:
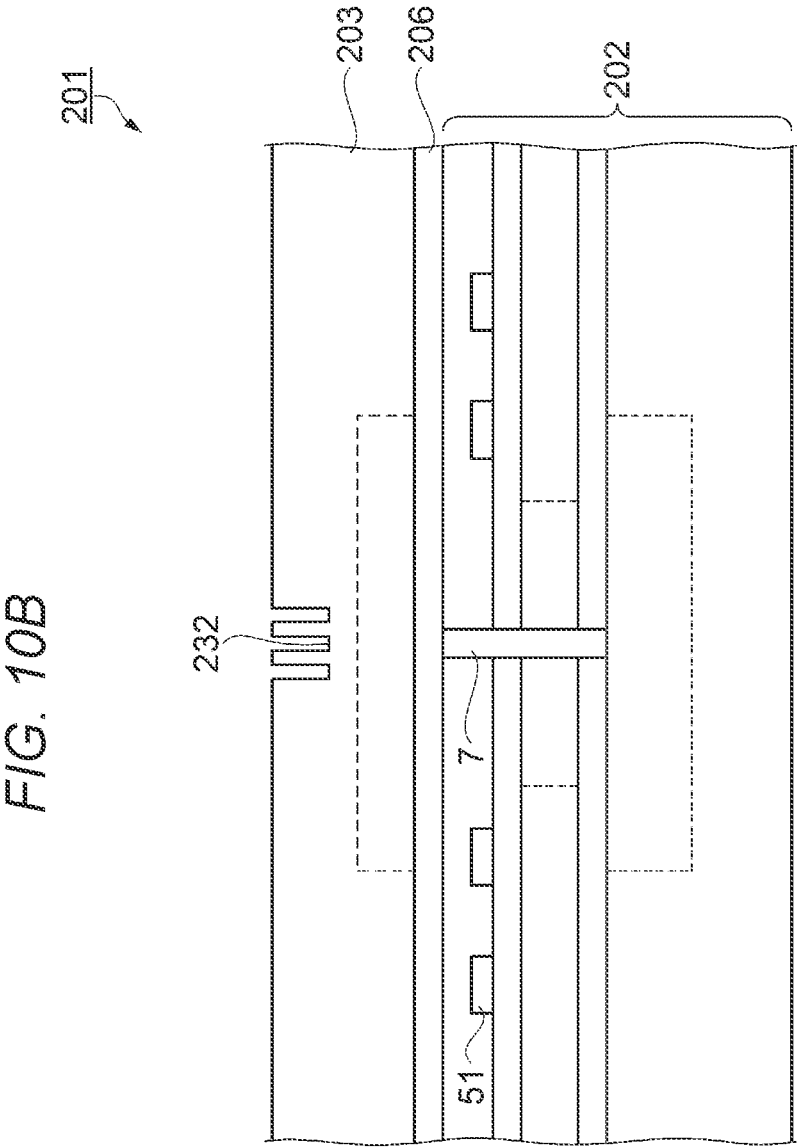
FIG. 10B is a diagram illustrating a manufacturing step.
Figure 10B:
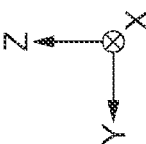

FIGS. 10A, 10B, and 10C are diagrams illustrating manufacturing steps of the inertial sensor according to the third embodiment.

FIG. 10A is a cross-sectional view showing the inertial sensor 201 before a base body 202 and a lid body 203 are bonded to each other. FIG. 10B is a cross-sectional view of the inertial sensor 201 when the base body 202 and the lid body 203 are bonded to each other. FIG. 10C is a cross-sectional view of the inertial sensor showing a state where a sealer 208 is formed by emission of the laser light L. FIGS. 10A, 10B, and 10C all show a cross section cut at a position of the line E-E in FIG. 8A.

As shown in FIG. 10A, in the inertial sensor 201 according to the third embodiment, a groove 233 is provided in the base body 202. The groove 233 is provided in an insulation layer 224, a semiconductor layer 223, and a buried insulation layer 222, exposes the insulation layer 224, the semiconductor layer 223, and the buried insulation layer 222 to an inner wall, and exposes a base substrate 221 to a bottom of the groove 233. Further, the groove 233 crosses the peripheral region P, and communicates an inner side of the cavity S with an outside.

A processed portion 232 having recesses is provided at a position overlapping the groove 233 in a plan view in the peripheral region P. In the present embodiment, the processed portion 232 is formed in an uneven shape having a plurality of recesses in a surface such that melting is easily performed by the laser light L. Further, a part of the processed portion 232 is disposed at a position overlapping an adhesive layer 206 in a plan view.

As shown in FIG. 10B, the base body 202 and the lid body 203 are thermocompression-bonded in a similar manner as in the first embodiment, and a first adhesive layer 206a and a second adhesive layer 206b form the adhesive layer 206. In the present embodiment, outermost surfaces of the first adhesive layer 206a on a base body 202 side and the second adhesive layer 206b on a lid body 203 side are both gold Au.

Since the base body 202 and the lid body 203 are adhered to each other, the groove 233 and the lid body 203 form the hole 7.

As shown in FIG. 10C, the laser light L is emitted to the processed portion 232 to form the sealer 208. The laser light L is emitted to the processed portion 232 from above the lid body 203, so that the lid body 203 between the processed portion 232 and the groove 233 is melted. The silicon melted from the lid body 203 penetrates the adhesive layer 206, buries the groove 233, and reaches the semiconductor layer 223, so that the sealer 208 is formed. The sealer 208 is provided in contact with the base body 202 and the lid body 203. That is, since the sealer 208 is provided in contact with the base body 202 without sandwiching the cavity S, as compared with a case where the cavity S is sandwiched, it is possible to prevent the melted silicon from scattering.

The sealer 208 includes a first portion 208a, a second portion 208b, a third portion 208c, a fourth portion 208d, a fifth portion 208e, and a sixth portion 208f.

The first portion 208a is a portion melted by emission of the laser light L on the lid body 203 side.

The second portion 208b is a portion made of an alloy formed of the melted silicon and the adhesive layer 206 when penetrating the adhesive layer 206.

The third portion 208c is a portion in contact with the insulation layer 224 exposed to the inner wall of the groove 233. Similar to the third portion 108c of the second embodiment, the third portion 208c is formed in a state where there is no interface between the melted silicon and the insulation layer 224, or a state where it is difficult to check the interface.

The fourth portion 208d is a portion in contact with the semiconductor layer 223 exposed to the inner wall of the groove 233. Since the semiconductor layer 223 is also made of silicon, the fourth portion 208d is formed in a state where there is no interface between the melted silicon and the semiconductor layer 223, or a state where it is difficult to check the interface.

The fifth portion 208e is a portion in contact with the buried insulation layer 222 exposed to the inner wall of the groove 233. Since the buried insulation layer 222 exposed to the inner wall of the groove 233 is formed of a silicon oxide film, the buried insulation layer 222 has good compatibility with the fifth portion 208e using the melted silicon as a main component. Therefore, the fifth portion 208e is formed in a state where there is no interface between the melted silicon and the buried insulation layer 222, or a state where it is difficult to check the interface.

The sixth portion 208f is a portion where the melted silicon reaches a base substrate 221, melts a surface of the base substrate 221, and adheres to the base substrate 221. Since the base substrate 221 is also made of silicon, the sixth portion 208f is formed in a state where there is no interface between the melted silicon and the base substrate 221, or a state where it is difficult to check the interface.

Therefore, similar to the first and second embodiments, the sealer 208 can also be configured to have a high effect of preventing entry of moisture from an outside into the cavity S along the interface.

Since the sealer 208 is in contact with the lid body 203, the semiconductor layer 223, and the base substrate 221, electrical conduction can be established among the lid body 203, the semiconductor layer 223, and the base substrate 221. Accordingly, excessive electric charges accumulated in the semiconductor layer 223 can be released to the lid body 203 and the base substrate 221, and malfunction can be prevented.

As described above, according to the inertial sensor 201 of the present embodiment, the following effects can be obtained in addition to the effects of the first and second embodiments.

Further, in the inertial sensor 201 according to the present embodiment, the base body 202 includes: the base substrate 221 serving as the substrate; the insulation layer 224 serving as the first insulation layer provided between the base substrate 221 and the lid body 203; the semiconductor layer 223 provided between the base substrate 221 and the insulation layer 224; and the buried insulation layer 222 serving as the second insulation layer provided between the base substrate 221 and the semiconductor layer 223. The hole 7 is provided in the insulation layer 224, the semiconductor layer 223, and the buried insulation layer 222, and includes the groove 233 opened toward the lid body 203. The sealer 208 is in contact with the base substrate 221.

According to the configuration, the hole 7 includes the groove 233 provided in the insulation layer 224, the semiconductor layer 223, and the buried insulation layer 222 of the base body 202, and the sealer 208 buries the groove 233 and is in contact with the base substrate 221, so that a good adhesion surface can be formed between the sealer 208 and the insulation layer 224, the semiconductor layer 223, the buried insulation layer 222 as well as the base substrate 221.

Further, in the inertial sensor 201 according to the present embodiment, the lid body 203, the semiconductor layer 223, and the base substrate 221 are electrically coupled to one another via the sealer 208.

According to the configuration, there is no need to provide separate wiring to conduct the lid body 203, the semiconductor layer 223, and the base substrate 221. Therefore, the number of components, the number of steps, and a cost can be reduced, and reliability can be improved.

4. Fourth Embodiment

4.1 Outline of Inertial Measurement Unit

Figure 11:
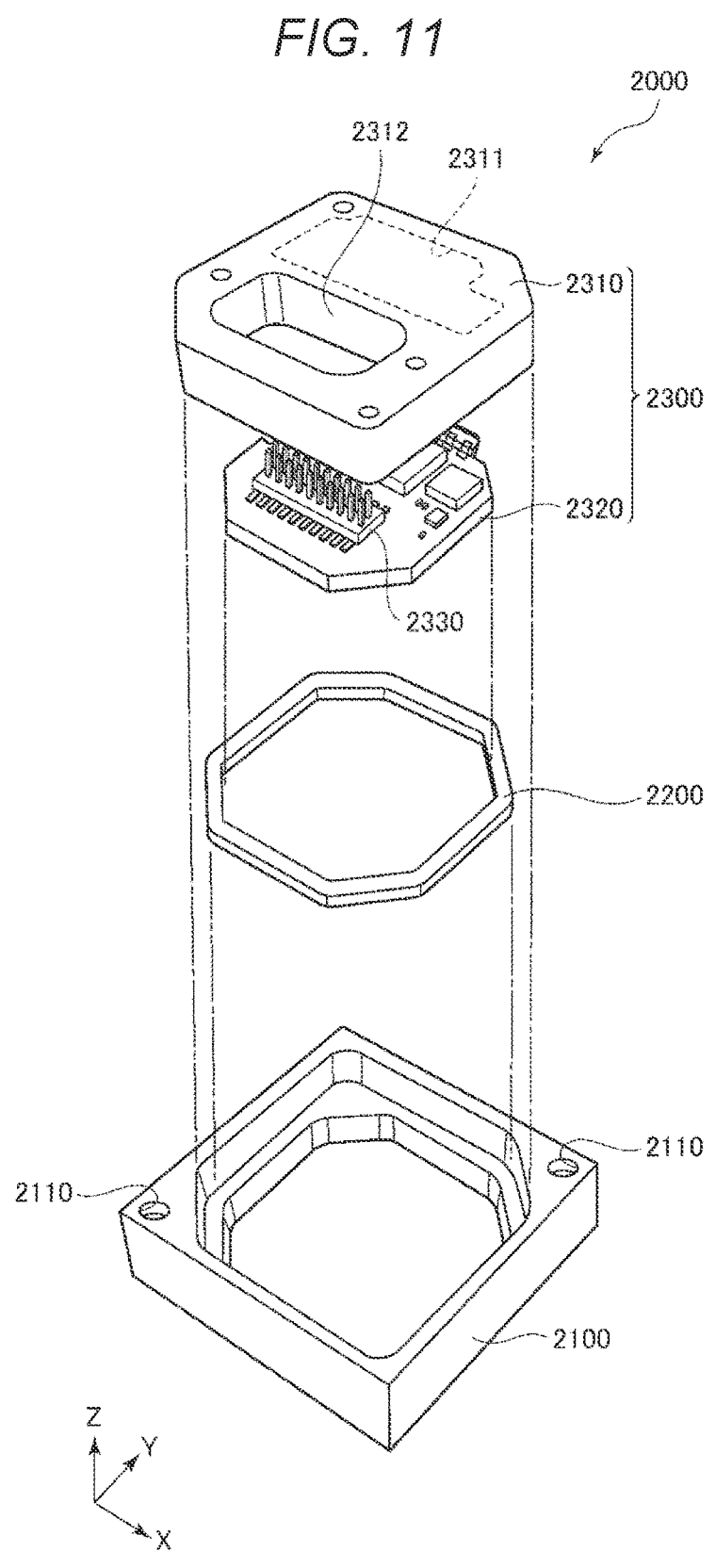
Figure 12:
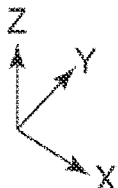
FIG. 12 is a perspective view of a substrate mounted with an inertial sensor used for the inertial measurement unit in FIG. 11.

FIG. 11 is an exploded perspective view showing an inertial measurement unit according to the present embodiment. FIG. 12 is a perspective view of a substrate including an inertial sensor mounted on the inertial measurement unit shown in FIG. 11.

An inertial measurement unit 2000 (IMU) is an inertial measurement unit that detects a posture and behavior of a device to be mounted such as an automobile or a robot. The inertial measurement unit 2000 functions as a six-axis motion sensor including a three-axis acceleration sensor and a three-axis angular velocity sensor.

The inertial measurement unit 2000 is a cuboid having a substantially square planar shape. Further, screw holes 2110 serving as fixers are formed in the vicinity of two vertexes positioned in a diagonal direction of the square. Two screws can pass through the two screw holes 2110 to fix the inertial measurement unit 2000 to a mounted surface of a mounted body such as an automobile. By selecting a component or changing a design, for example, it is also possible to reduce a size to an extent that can be mounted on a smartphone or a digital camera.

The inertial measurement unit 2000 includes an outer case 2100, a bonding member 2200, and a sensor module 2300, and has a configuration in which the sensor module 2300 is inserted into the outer case 2100 with the bonding member 2200 interposed therebetween. Similar to the above-described overall shape of the inertial measurement unit 2000, an outer shape of the outer case 2100 is a cuboid having a substantially square planar shape. The screw holes 2110 are formed in the vicinity of the two vertexes positioned in the diagonal direction of the square. Further, the outer case 2100 has a box shape, and the sensor module 2300 is housed therein.

The sensor module 2300 includes an inner case 2310 and a substrate 2320. The inner case 2310 is a member that supports the substrate 2320, and has a shape that fits inside the outer case 2100. Further, a recess 2311 for preventing contact with the substrate 2320 and an opening 2312 for exposing a connector 2330 described later are formed in the inner case 2310. Such an inner case 2310 is bonded to the outer case 2100 by the bonding member 2200. Further, the substrate 2320 is bonded to a lower surface of the inner case 2310 by an adhesive.

As shown in FIG. 12, the connector 2330, an angular velocity sensor 2340z that detects an angular velocity around the Z axis, an acceleration sensor 2350 that detects acceleration in each of X-axis, Y-axis, and Z-axis directions, and the like are mounted on an upper surface of the substrate 2320. Further, an angular velocity sensor 2340x that detects an angular velocity around the X axis and an angular velocity sensor 2340y that detects an angular velocity around the Y axis are mounted on side surfaces of the substrate 2320. The inertial sensor 1 according to the present embodiment can be used as the acceleration sensor 2350.

A control IC 2360 serving as a control circuit is mounted on a lower surface of the substrate 2320. The control IC 2360 is a micro controller unit (MCU), and controls units of the inertial measurement unit 2000. A storage unit stores a program defining an order and contents for detecting acceleration and an angular velocity, a program for digitizing detection data and incorporating the digitized detection data into packet data, accompanying data, and the like. In addition, a plurality of electronic components are mounted on the substrate 2320.

As described above, according to the inertial measurement unit 2000 of the present embodiment, the following effects can be obtained in addition to the effects of the first to third embodiments.

The inertial measurement unit 2000 according to the present embodiment includes the inertial sensor 1 described above, and the control IC 2360 serving as the control circuit that controls driving of the inertial sensor 1.

According to the configuration, it is possible to provide an excellent inertial measurement unit 2000 that can maintain reliability over a long period of time.

What is claimed is:

1. An inertial sensor comprising:

three mutually orthogonal axes being defined as an X-axis, a Y-axis, and a Z-axis, a direction parallel to the X-axis being defined as an X-axis direction, a direction parallel to the Y-axis being defined as a Y-axis direction, and a direction parallel to the Z-axis being defined as a Z-axis direction;

a base substrate made of a silicon material including a first upper surface and a first lower surface that are outwardly opposite to each other and extend perpendicular to the Z-axis, and a first recess provided on the first upper surface;

a buried insulation layer formed on an outer edge of the first upper surface of the base substrate and surrounding the first recess;

a semiconductor layer arranged so as to overlap an uppermost surface of the buried insulation layer and the first recess in a plan view from the Z-axis direction; and a lid body made of the silicon material including a second upper surface and a second lower surface that are outwardly opposite to each other and extend perpendicular to the Z-axis, and a second recess is provided on the second lower surface, the second recess facing the semiconductor layer, wherein the semiconductor layer has a capacitance element formed in a central area thereof, and the capacitance element faces the first recess and the second recess, an insulation layer is in a frame shape and is formed on an outer peripheral edge of the semiconductor layer, and the insulation layer faces the lid body, the insulation layer and an outer edge of the lid body surrounding the second recess are bonded with an adhesive layer, a groove is formed on the outer edge of the lid body and connects a cavity inside the second recess to an outside of the lid body prior to sealing, a hole is formed in the groove that opens to the outside of the lid body and connects the cavity to the outside by the adhesive layer and the insulation layer prior to sealing, a sealer that seals the hole and is formed by melting a processed portion of the lid body, and the sealer includes the silicon material of the lid body mixed with a material of the adhesive layer.

2. The inertial sensor according to claim 1, wherein the sealer is in contact with the insulation layer.

3. The inertial sensor according to claim 1, wherein the lid body includes the processed portion at a position overlapping the sealer in the plan view from the Z-axis direction, and another recess is disposed in the processed portion.

4. An inertial measurement unit comprising:

the inertial sensor according to claim 1; and a control circuit configured to control driving of the inertial sensor.

* * * * *